(12) United States Patent
Fujii et al.

(10) Patent No.: US 7,218,502 B2
(45) Date of Patent: May 15, 2007

(54) BONDING MEMBER AND ELECTROSTATIC CHUCK

(75) Inventors: Tomoyuki Fujii, Nagoya (JP); Yutaka Mori, Nagoya (JP); Akiyoshi Hattori, Hamia (JP)

(73) Assignee: NGK Insulators, Ltd., Nagoya (JP)

( * ) Notice: Subject to any disclaimer, the term of this patent is extended or adjusted under 35 U.S.C. 154(b) by 438 days.

(21) Appl. No.: 10/790,259

(22) Filed: Mar. 1, 2004

(65) Prior Publication Data

US 2004/0240142 A1    Dec. 2, 2004

(30) Foreign Application Priority Data

Mar. 7, 2003    (JP) .......................... P2003-062040

(51) Int. Cl.
*H01L 21/683* (2006.01)
*B23B 31/02* (2006.01)

(52) U.S. Cl. .................................... 361/234; 228/122.1

(58) Field of Classification Search ................. 361/234; 228/122.1, 126, 132, 187, 230
See application file for complete search history.

(56) References Cited

U.S. PATENT DOCUMENTS 5,670,063 A * 9/1997 Hegner et al. ........... 219/85.22
5,777,838 A * 7/1998 Tamagawa et al. ......... 361/234
5,995,357 A * 11/1999 Ushikoshi et al. .......... 361/234

FOREIGN PATENT DOCUMENTS

| JP | 11-228245 |   | 8/1999 |
| JP | 2000-344584 | * | 12/2000 |
| JP | 2001-010873 |   | 1/2001 |
| JP | 2001-122673 |   | 5/2001 |
| WO | WO 01/63972 | * | 8/2001 |

* cited by examiner

*Primary Examiner*—Stephen W. Jackson
*Assistant Examiner*—Scott Bauer
(74) *Attorney, Agent, or Firm*—Burr & Brown

(57) ABSTRACT

A bonding member is provided, including, a ceramic member having a concave portion, a metal member having a convex portion corresponding to the concave portion of the ceramic member. A first bonding material joins a bottom portion of the concave portion of the ceramic member and a tip portion of the convex portion of the metal member. The first bonding material has a porous structure, including particles and a brazing filler metal, and covers a corner between tip and side portions of the metal member. A second bonding material including a brazing filler metal joins the side portion of the concave portion of the ceramic member and the side portion of the convex portion of the metal member.

11 Claims, 4 Drawing Sheets

BONDING MEMBER AND ELECTROSTATIC CHUCK

CROSS-REFERENCE TO RELATED APPLICATIONS

This application is based upon and claims the benefit of priority from prior Japanese Patent Application P2003-062040 filed on Mar. 7, 2003, the entire contents of which are incorporated by reference herein.

BACKGROUND OF THE INVENTION

1. Field of the Invention

The present invention relates to a bonding member including two or more of different kinds of members joined together. More particularly, the present invention relates to an electrostatic chuck which can be suitably used in a semiconductor manufacturing device.

2. Description of the Related Art

Conventionally, a brazing material has been used in a method for bonding a ceramic member and a metal member. However, during the cooling operation after bonding is performed at a high temperature, thermal stress occurs due to the difference in the coefficient of thermal expansion between the different kinds of members, or between the members and the brazing material used to join these different kinds of members. Accordingly, peeling or cracks occur in the vicinity of the bonding interface when one of the members is fragile. Thus, the desired bonding strength and airtightness may not be obtained. Products in which such problems as described above arise in a manufacturing process thereof have to be disposed of as defective products. Thus, the problems described above contribute to increasing product costs of these bonding members. Moreover, if there is a heat cycle when the members are used, the problems described above arise after the members are used for a fixed period of time. Accordingly, the problems also lower the reliability of the product.

In consideration of the present situation described above, a bonding method has been studied which maintains moderate bonding strength between different kinds of members, without lowering the bonding strength due to thermal stress in the vicinity of the bonding interface during a cooling operation after bonding is performed at a high temperature, and without generating cracks in a cooling operation for a member that is vulnerable to the thermal stress. For example, there is disclosed a method for obtaining a bonding layer by using brazing filler metal as a base and adding particles to the brazing filler metal which lower thermal stress (for example, see Japanese Patent No. 3315919). Moreover, there is also disclosed a method for joining different kinds of members together when a width of a gap existing between wall surfaces of the different kinds of members in a fitting structure portion is narrow (for example, see Japanese Patent Laid-Open No. 2001-10873). Furthermore, there is also disclosed a bonding adhesive composition which includes a brazing filler metal and a mixture of at least two kinds of particles having different wettability from the brazing filler metal (for example, see Japanese Patent Laid-Open No. 2001-122673).

Moreover, as a product which requires bonding of a ceramic member and a metal member, for example, an electrostatic chuck used in a semiconductor process or the like is enumerated. In this electrostatic chuck, the ceramic member and the metal member are joined together in a portion of a substrate, which has built-in electrodes and is made of ceramics or the like, and a terminal, which supplies power to the built-in electrodes, and is made of gold-plated molybdenum or the like.

As described above, various methods for joining a ceramic member and a metal member have been known which do not cause a lowering of bonding strength nor generate cracks during a cooling operation for a member that is vulnerable to thermal stress. However, even by using the methods described above, residual stress is likely to be concentrated in a corner portion when different kinds of members are joined by adopting a structure in which a concave portion is fitted to a convex portion. Therefore, cracks sometimes occur.

SUMMARY OF THE INVENTION

According to a first aspect of the present invention, a bonding member is provided, including a ceramic member having a concave portion, a metal member having a convex portion fitted to the concave portion, a first bonding material joining a bottom portion of the concave portion of the ceramic member and a tip portion of the convex portion of the metal member and having a porous structure including particles and brazing filler metal that covers a corner between tip and side portions of the metal member, and a second bonding material including a brazing filler metal joining a side portion of the concave portion of the ceramic member and a side portion of the convex portion of the metal member.

According to a second aspect of the present invention, an electrostatic chuck for adsorbing an object to be processed is provided. The electrostatic chuck comprises a substrate including an electrode therein and having a concave terminal bonding hole, a terminal member made of a different material from that of the substrate and which supplies power to the electrode, a bottom portion bonding material joining a bottom portion of the terminal bonding hole and a tip portion of the terminal and having a porous structure including particles and a brazing filler metal that covers a corner between tip and side portions of the terminal, and a side portion bonding material including a brazing filler metal joining a side portion of the terminal bonding hole and the side portion of the terminal.

DETAILED DESCRIPTION OF THE INVENTION

Figure 1A:
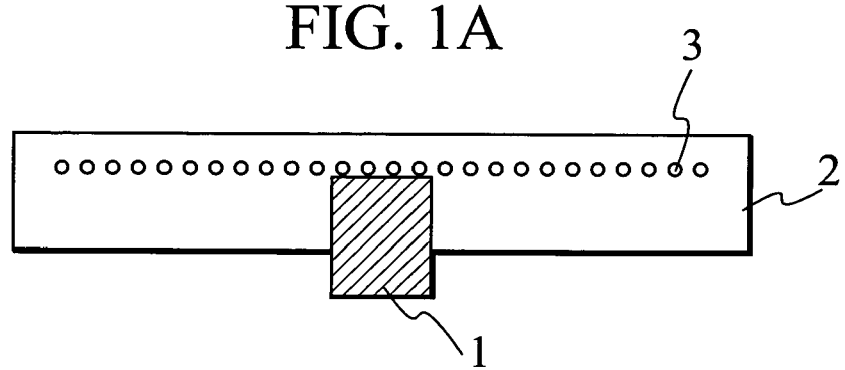
FIG. 1A is a cross-sectional view of an electrostatic chuck according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

According to one embodiment of the present invention, a bonding member is provided, including a first member having a concave portion, a second member which is made of a different material from that of the first member and which has a convex portion fitted to the concave portion, a first bonding material joining a bottom portion of the concave portion of the first member and a tip portion of the convex portion of the second member and having a porous structure including particles and a brazing filler metal that covers a corner between tip and side portions of the second member, and a second bonding material including a brazing filler metal joining a side portion of the concave portion of the first member and a side portion of the convex portion of the second member.

Examples of a combination of two or more different kinds of members to be used in the bonding member according to the embodiment of the present invention include: a combination of a ceramic member, such as aluminum nitride and silicon nitride, and a metal member such as molybdenum, Fe—Ni—Co alloy and tungsten; and a combination of different kinds of ceramic members made from different raw materials. To be more specific, a bonding member is provided which is used in the manufacture of a semiconductor wafer and which is formed by connecting and joining an aluminum nitride member, which exerts an electrostatic chuck function and a heater function by use of built-in metal electrodes and metal heating elements, and a metal molybdenum member, for example, which is joined as a terminal supplying power to the built-in metal electrode member and the like.

Hereinafter, description will be given of an exemplary case where an electrostatic chuck is used as the bonding member according to the embodiment of the present invention.

FIG. 1A shows an example of the electrostatic chuck according to the embodiment of the present invention. The electrostatic chuck includes a substrate 2 including an electrode 3 and a terminal 1 which supplies power to the electrode 3. The substrate 2 has a rough disc shape made of an aluminum nitride sintered body and has the electrode 3 buried therein. The electrode 3 is made of metal such as molybdenum and may be a wire mesh electrode or a screen printed electrode. At a supporting portion side of the substrate 2, the terminal 1 is buried. An upper surface of the terminal 1 is connected to the electrode 3. An end face of the terminal 1 is exposed to a back of the substrate 2. The terminal 1 is made of molybdenum subjected to gold plating, for example.

Figure 1B:
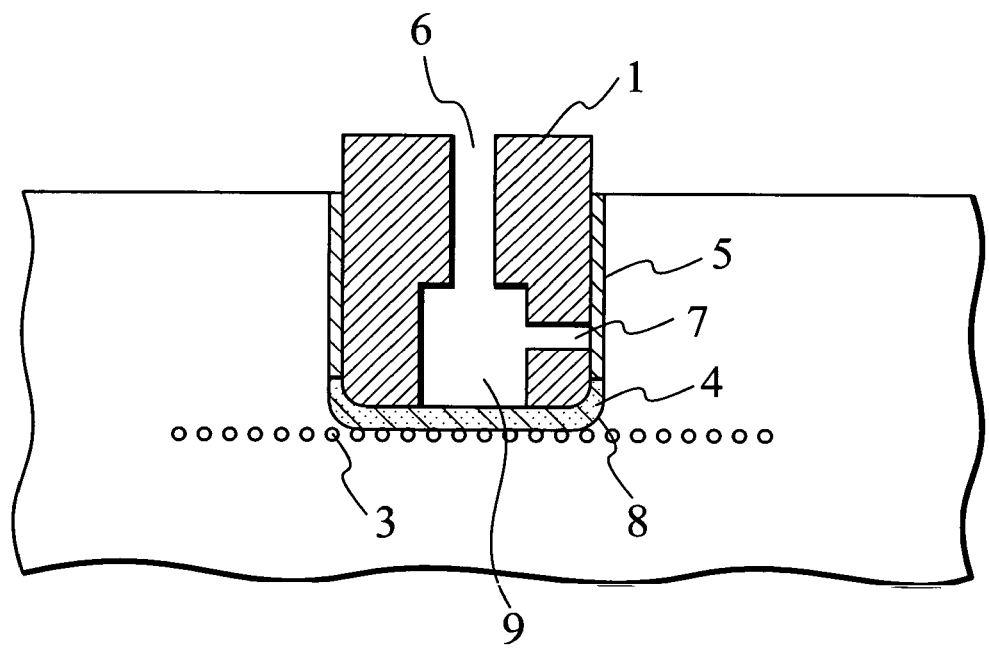
FIG. 1B is an enlarged view of a bonding portion between a terminal and an electrode, which is shown in FIG. 1A.

FIG. 1B is an enlarged view of a bonding section of the terminal 1 and the electrode 3, which are shown in FIG. 1A. FIG. 1B is turned upside down from FIG. 1A. The substrate 2 has a concave terminal bonding hole 8 for joining the terminal 1. At a bottom of the concave terminal bonding hole 8, the electrode 3 is exposed. A tip portion of the terminal 1 and the electrode 3 are joined by a bottom portion bonding material 4, and a side of the terminal 1 and a side of the terminal bonding hole 8 are joined by a side portion bonding material 5. In the terminal 1, a vertical direction vent hole 6 and a horizontal direction vent hole 7 are provided.

Figure 1C:
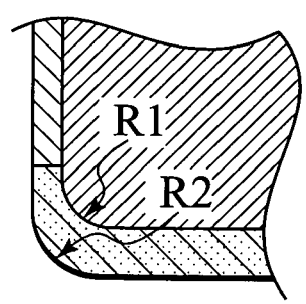
FIG. 1C is an enlarged view of a corner portion of the terminal and a terminal bonding hole, which is shown in FIG. 1B.

As shown in FIG. 1C, the bottom portion bonding material 4 joins the terminal 1 and the electrode 3 so as to cover a corner between the tip and side portions of the terminal 1. Moreover, a corner radius R1 between the tip and side portions of the terminal 1 and a corner radius R2 between the bottom and side portions of the terminal bonding hole 8 are designed to have a relationship of $R1 \geq R2 \times 0.6$. As described above, the corners of the terminal 1 and the terminal bonding hole 8 are designed to effectively prevent cracks in a corner portion where stress is concentrated. Furthermore, the corner radius R1 between the tip and side portions of the terminal 1 is 0.3 mm or more. In a conventional electrostatic chuck, the corner radius R1 of the terminal 1 is as small as about 0.1 mm. Thus, by increasing the radius as described above, it is made easier for the bottom portion bonding material 4 to cover the corner.

The bottom portion bonding material 4, which is porous, may be made of only brazing filler metal. However, it is preferable that the bottom portion bonding material 4 includes brazing filler metal and particles. In order to lower thermal stress, as the particles, at least two or more kinds of particles are used, which have different wettability from the brazing filler metal. The brazing filler metal and particles having good wettability with the brazing filler metal and particles having poor wettability with the brazing filler metal are mixed together and the brazing filler metal is melted. Accordingly, the brazing filler metal permeates through the foregoing particles and a bonding layer is formed. The brazing filler metal and the particles are mixed at a ratio of 70:30 to 10:90 and used. Moreover, the bonding may be also made by previously filling a predetermined amount of particles in bonding spots and pouring a predetermined amount of brazing filler metal in its melted state thereinto. It is desirable that a thickness of the bottom portion bonding material 4 is 0.1 to 0.6 mm.

Examples of the brazing filler metal used for the bottom portion bonding material 4 include: a noble metal, such as Au, Ag, Cu and Pd, as a base; a general-purpose brazing filler metal including a metal, such as Al and Ni, as a base; and the like. There is no particular limitation on the materials. Accordingly, more suitable materials may be selected based on the relationship between the brazing filler metal and the property of a member to be joined. It is desirable that the porosity of the bottom portion bonding material 4 after bonding is 20 to 80%.

Moreover, suitable examples of the particles include: ceramic particles; cermet particles which are a composite material of ceramic and metal; low thermal expansion metal particles; and the like. Examples of ceramic particles include particles of silicon nitride, aluminum nitride, alumina, silicon carbide and the like. Examples of cermet particles include particles of $Ni-Al_2O_3$, $Cu-Al_2O_3$ and the like. Examples of low thermal expansion metal particles include particles of metal such as molybdenum and tungsten, which have a low coefficient of thermal expansion at high temperature. In order to efficiently lower the thermal stress, it is required to keep the average particle size of the materials described above within a fixed range. The average particle size is preferably 1 to 100 μm, more preferably 30 to 80 μm. It is needless to say that there is no harm in mixing two or more kinds of particles having different average particle sizes from each other and using the mixture. In the case of using ceramic particles, the wettability thereof with the brazing filler metal becomes a problem. Thus, it is required to plate a surface of the particles with metal such as Ni, Cu and Ag, for example, or to cover the surface with coating of Au, Ag, Ti or the like by sputtering. The plating method is not particularly limited. Electroless plating and the like are suitably used. In this event, it is desirable that the thickness of the plating is 1 to 5 μm.

Moreover, the wettability with the brazing filler metal differs by mixing coated particles and uncoated particles. Thus, the porosity of the first bonding material after being joined can be controlled. The mixture ratio of the coated particles and the uncoated particles is preferably within 10:90 to 90:10, more preferably 30:70 to 70:30.

The side portion bonding material 5 includes brazing filler metal. Examples of the brazing filler metal used for the side portion bonding material 5 include: a noble metal, such as Au, Ag, Cu and Pd, as a base; a general-purpose brazing filler metal including metal, such as Al and Ni, as a base; and the like. There is no particular limitation on the materials. Accordingly, more suitable materials may be selected based on the relationship between the brazing filler metal and the property of the member to be joined. It is desirable that the porosity of the brazing filler metal is 20 to 80%. The side portion bonding material 5 has a two-layer structure. In the case of using a brazing filler metal of Al—Ni—Au, there are an Al-rich layer and an Al—Ni—Au intermetallic compound layer.

Moreover, it is desirable that the thickness of the side portion bonding material 5 is 0.008 to 0.012 times a diameter of the terminal 1. When the thickness thereof is 0.012 times the diameter or more, residual stress is increased by thermal expansion. Meanwhile, when the thickness thereof is 0.008 times the diameter or less, there is only a hard intermetallic compound layer. Thus, the stress absorption effect is lost. In either case, cracks are likely to occur.

Moreover, the terminal 1 has therein a bonding material housing hole 9 which houses a bonding material for joining the terminal 1 and the substrate 2 or the electrode 3. The terminal 1 having the bonding material housed in the bonding material housing hole 9 is placed in the terminal bonding hole 8 and bonding is made. Thus, the terminal 1 can be joined with the substrate 2 or the electrode 3.

Moreover, the terminal 1 has at least one vent hole running in at least one of a vertical and a horizontal direction in the terminal 1. The vent holes 6 and 7 can let gas escape to the outside, the gas being generated from the bonding materials in bonding. Thus, the bottom portion bonding material 4 and the side portion bonding material 5 sufficiently permeate between the terminal 1 and the terminal bonding hole 8. Moreover, it is possible to prevent wicking of the bonding materials. FIG. 1B shows both the vertical direction vent hole 6 and the horizontal direction vent hole 7. However, it is needless to say that the terminal 1 may have any one of the vent holes.

In the electrostatic chuck according to the embodiment of the present invention, the bottom portion bonding material 4 covers the corner between the tip and side portions of the terminal 1. Thus, it is possible to prevent cracks caused in the corner portion by the concentrated stress. Accordingly, in the electrostatic chuck according to the embodiment of the present invention, cracks are unlikely to occur in the substrate, which includes a member vulnerable to thermal stress, in a cooling operation after bonding. Moreover, when the corner radius between the tip and side portions of the terminal 1 is R1 and the corner radius between the bottom and side portions of the terminal bonding hole is R2, the condition of R1≧R2×0.6 is satisfied. Accordingly, there is a difference between the corner radius of the terminal 1 and the corner radius of the terminal bonding hole 8. Thus, it becomes easy for the bottom portion bonding material 4 to cover the corner of the tip portion of the terminal 1. Consequently, more sufficient covering is made possible. Furthermore, the corner radius between the tip and side portions of the terminal 1 is set as large as 0.3 mm or more. Thus, the bottom portion bonding material 4 can cover the corner of the tip portion of the terminal 1. Consequently, the bonding strength between the substrate and the terminal can be maintained.

Similarly, in the bonding member according to the present invention, the first bonding material joins the bottom portion of the concave portion of the first member (for example, a ceramic member) and the tip portion of the convex portion of the second member (for example, a metal member) and covers the corner between the tip and side portions of the second member. Thus, it is possible to prevent cracks caused in the corner portion by the concentrated stress. Accordingly, in the bonding member according to the present invention, cracks are unlikely to occur in the substrate, which includes a member vulnerable to thermal stress, in a cooling operation after bonding. Moreover, when the corner radius between the tip and side portions of the convex portion 1 is R1 and the corner radius between the bottom and side portions of the concave portion is R2, the condition of R1≧R2×0.6 is satisfied. Accordingly, there is a difference between the corner radius of the convex portion and the corner radius of the concave portion. Thus, it becomes easy for the first bonding member to cover the corner of the convex portion. Consequently, more sufficient covering is made possible. Furthermore, the corner radius between the tip and side portions of the convex portion is set as large as 0.3 mm or more. Thus, the first bonding member can cover the corner of the convex portion. Consequently, the bonding strength between different kinds of members can be maintained.

Moreover, the bonding member according to the present invention has at least one vent hole penetrating in at least one of the vertical direction and the horizontal direction inside the convex portion from the bottom portion of the convex portion. This vent hole allows gas generated from the brazing materials or the like in bonding to escape to the outside. Thus, the first and second bonding materials sufficiently permeate between the convex portion and the concave portion. Moreover, it is possible to prevent wicking of the brazing filler metal.

Next, description will be given of a method for manufacturing an electrostatic chuck according to the embodiment of the present invention. Here, with reference to FIG. 2, description will be given of the processing up to the stage before the terminal is joined.

First, the material of the substrate is adjusted (S201). Specifically, as a raw material of the substrate of the electrostatic chuck, oxide additives are added to an aluminum nitride powder. As the oxide additives, yttria, ceria and the like are used. Thereafter, the aluminum nitride powder and the oxide additives are mixed. As a mixing method, for example, a large ball mill device called a trommel, in which a container itself rotates, is used technically. The time required for mixing by use of the trammel is about 30 minutes, for example. Granulation is performed by adding a binder to the raw material powder.

Next, powder calcination is performed (S202). Normally, calcination is performed after formation processing. However, in the case of manufacturing an electrostatic chuck which has a buried electrode made of metal such as molybdenum, the electrode undergoes oxidation due to the calcination. Accordingly, the calcination is performed before the formation processing.

Next, the electrode is buried and the formation processing of the aluminum nitride powder is performed (S203). As a forming method, cold isotropic pressing (Cold Isostatic Pressing: CIP) processing may be used, in which a uniaxial compact obtained by a mold forming method is subjected to isotropic forming processing to improve a compact density and eliminate unevenness. It is also possible to obtain a compact by filling a raw material powder directly in a rubber mold and performing the CIP processing, without performing mold formation.

Next, the aluminum nitride powder after formation is sintered to produce an aluminum nitride sintered body (S204). As this sintering method, atmospheric pressure sintering or hot pressing can be used. In hot pressing, a raw material powder or a compact is filled in or inserted into carbon jigs and fired under uniaxial pressure of 30 to 50 MPa. Accordingly, hot pressing is suitable for firing a ceramic material which is difficult to densify under normal atmospheric pressure sintering. Furthermore, hot isostatic pressing (HIP, in which the principle of CIP is applied to firing, can be also used.

Next, the aluminum nitride sintered body is subjected to processing for placing the terminal (S205). Specifically, in the aluminum nitride sintered body to be the substrate, a concave terminal bonding hole for joining the terminal is formed. As this processing, cutting and polishing by use of diamond tools and the like are enumerated. Besides the above, ceramic processing by laser processing, ultrasonic machining, sand blasting or the like is also possible.

Next, with reference to FIG. 3, description will be given of the steps of joining the terminal with the substrate of the electrostatic chuck.

First, the terminal bonding hole of the substrate is cleaned (S301). The cleaning is performed using acetone, isopropyl alcohol (IPA), ammonia, pure water and the like. Thereafter, the bottom and side of the terminal bonding hole are coated with about 1 to 5 μm of Ni plating (S302). Next, a mixture of Ni-plated ceramic particles and unplated ceramic particles is laid on the Ni-plated bottom of the hole and is smoothed.

Meanwhile, as to the terminal, molybdenum is processed to have a shape of the terminal and a nickel coating is applied thereto as an undercoat. Thereafter, the terminal is coated with about 10 μm of gold plating. Before the plating, the corner radius R1 between the tip and side portions of the terminal is set to 0.3 mm or more. Moreover, the corner radius R1 between the tip and side portions of the terminal and the corner radius R2 between the bottom and side portions of the terminal bonding hole are processed to have a relationship of $R1 \geq R2 \times 0.6$. Moreover, the bonding material housing hole 9 is formed in the tip of the terminal and the vent holes 6 and 7, which are connected to the bonding material housing hole 9, are formed in the terminal. Thereafter, particles are filled in the bottom portion so as to cover the corner between the bottom and side portions of the terminal bonding hole 8. Subsequently, the terminal 1 having brazing filler metal set in the bonding material housing hole 9 is placed in the terminal bonding hole 8 (S303).

Next, a load is applied to the substrate 2 from above the terminal 1 (S304). The load is, for example, about 125 g. Subsequently, bonding is performed in a vacuum furnace (S305). As conditions of the bonding, for example, the substrate is heated at 700° C. for 10 minutes. In this event, the brazing filler metal set in the bonding material housing hole 9 of the terminal 1 is melted to permeate through the particles. Thus, a bonded composition including the brazing filler metal and the particles forms the bottom portion bonding material 4. Moreover, the brazing filler metal permeating through the side forms the side portion bonding material 5. Thereafter, cooling processing is performed. Cooling time may be determined in consideration for characteristics of different kinds of members to be joined and the like. Normally, the cooling time is within 1 to 10 hours. It is more preferable to adopt an annealing method in the cooling operation since an influence of thermal stress can be significantly lowered. Note that the annealing method means cooling performed for about twice the time spent for the normal cooling method or more. Thus, the annealing can minimize the influence of the thermal stress on the bonding portion.

Thereafter, the substrate is taken out of the vacuum furnace and the substrate is subject to visual inspection, dimensional measurements, strength tests and the like (S306).

By using the method for joining different kinds of members according to the present invention, the bottom portion bonding material 4 covers the corner between the tip and side portions of the terminal 1 and the occurrence of cracks in the corner portion due to concentrated stress can be prevented. Thus, by use of the method for joining different kinds of members according to the present invention, cracks are not likely to occur in the substrate, which includes a member vulnerable to thermal stress, in the cooling operation during bonding. Moreover, when the corner radius between the tip and side portions of the terminal 1 is R1 and the corner radius between the bottom and side portions of the terminal bonding hole 8 is R2, the condition of $R1 \geq R2 \times 0.6$ is satisfied. Accordingly, there is a difference between the corner radius of the terminal 1 and the corner radius of the terminal bonding hole 8. Thus, it becomes easy for the bottom portion bonding material 4 to cover the corner of the tip portion of the terminal 1. Consequently, more sufficient covering is made possible. Furthermore, the corner radius between the tip and side portions of the terminal 1 is set as large as 0.3 mm or more. Thus, the bottom portion bonding material 4 can cover the corner of the tip portion of the terminal 1. Consequently, the bonding strength between the substrate and the terminal can be maintained.

ADDITIONAL EMBODIMENTS

The present invention has been described according to the embodiment described above. It should be understood that the present invention is not limited to the description and drawings which constitute a part of the present disclosure. Various alternative embodiments, embodiments and operational technologies will become apparent to those skilled in the art from the present disclosure.

For example, in the above-described embodiment according to the present invention, an electrostatic chuck was described as an example of the conbonding member. Besides the electrostatic chuck embodiment, the present invention is also applicable to situations in which two or more different kinds of members are joined using a brazing filler metal and the like, for example, a bonding member obtained by joining a porous ceramic member and a metal member having a remarkably high coefficient of thermal expansion and a bonding member obtained by joining ceramic members having different coefficients of thermal expansion from each other or joining metal members having different coefficients of thermal expansion from each other. To be more specific, examples include: a bonding member for gas separation, which is formed by joining a porous alumina member used for gas separation and a metal port member to be mounted on various gas analyzers; and the like. It is needless to say that the bonding member according to the present invention also includes a bonding member formed by joining three or more different kinds of members.

Bonding temperature: 700° C.;

Retention time: 10 minutes; and

Atmosphere: vacuum (10-3 Pa).

The foregoing bonding test was performed for twenty electrostatic chucks and the number of electrostatic chucks which showed the occurrence of cracks was evaluated. The results are shown in Table 1.

TABLE 1

| No. | Terminal diameter (mm) | Corner radius R1 (mm) | Corner radius R2 (mm) | Thickness of side portion bonding material (mm) | Number of no occurrence of cracks (/20) | Yield (%) |
|---|---|---|---|---|---|---|
| Example 1 | 5 | 0.3 | 0.3 | 0.05 | 19 | 95 |
| Example 2 | 10 | 0.3 | 0.5 | 0.10 | 18 | 90 |
| Comparative Example 1 | 5 | 0.3 | 0.8 | 0.05 | 10 | 50 |
| Comparative Example 2 | 10 | 0.3 | 0.8 | 0.10 | 9 | 45 |
| Comparative Example 3 | 5 | 0.5 | 0.3 | 0.02 | 10 | 50 |
| Comparative Example 4 | 5 | 0.3 | 0.8 | 0.08 | 8 | 40 |
| Comparative Example 5 | 5 | 0.1 | 0.5 | 0.05 | 8 | 40 |

Various modifications will become possible for those skilled in the art after receiving the teachings of the present disclosure without departing from the scope thereof.

EXAMPLES

Examples and Comparative Examples of the present invention will be described below. In the following Examples and Comparative Examples, an electrostatic chuck that was used as a bonding member between a substrate, which included a built-in electrode and was made of aluminum nitride, and a terminal which supplied power to the built-in electrode and was made of gold-plated molybdenum. The electrode was a wire mesh.

Example 1

Figure 2:
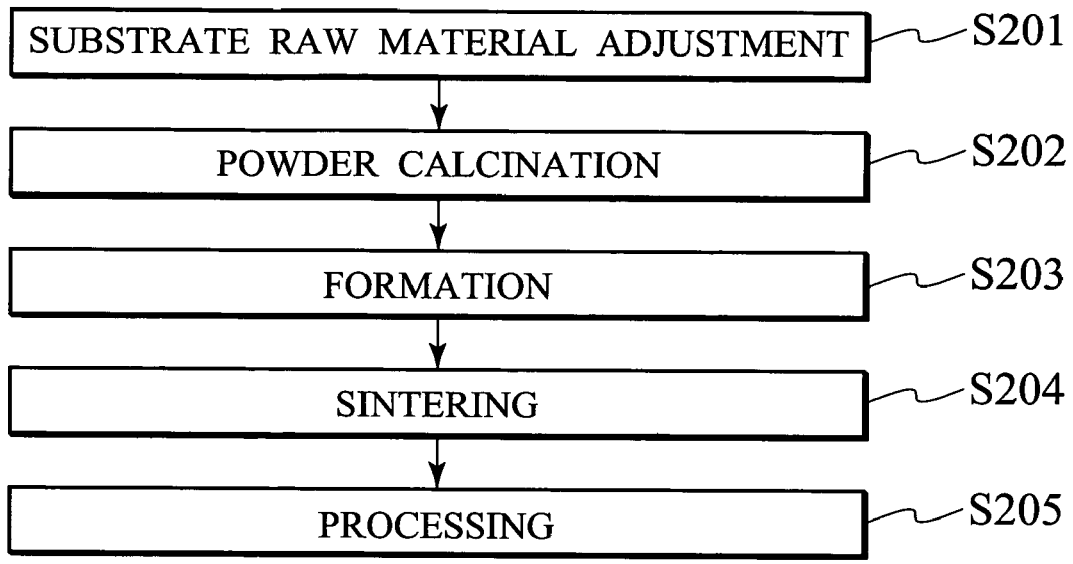
FIG. 2 is a flowchart showing the steps of a method for manufacturing the electrostatic chuck according to one embodiment of the present invention.
Figure 3:
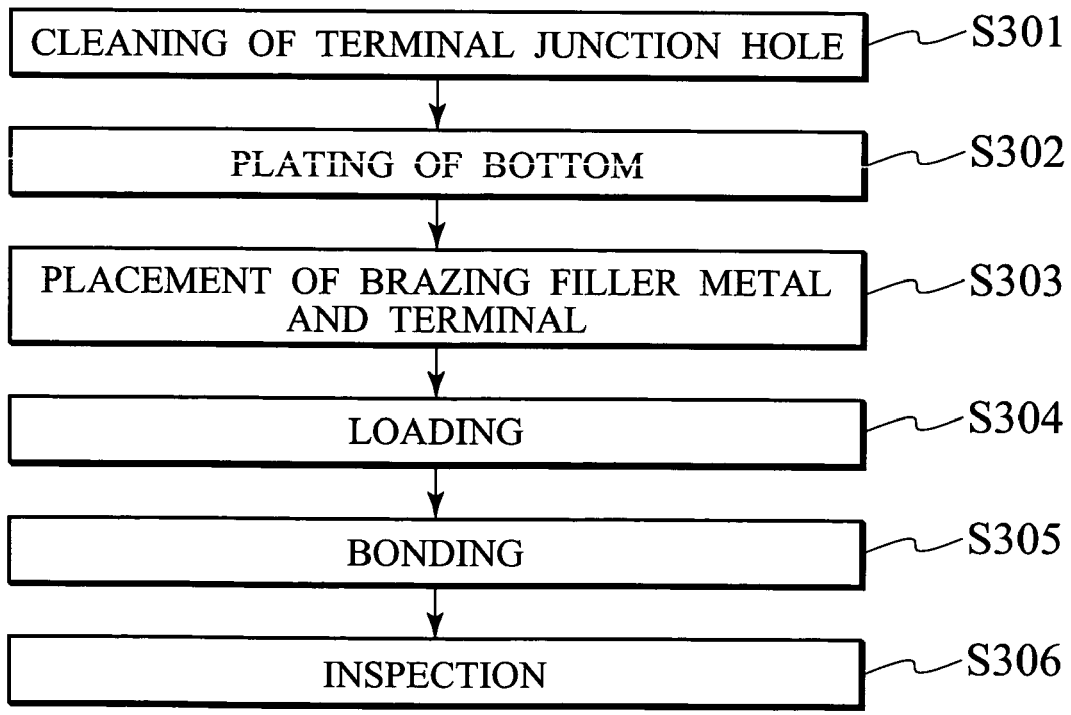
FIG. 3 is a flowchart showing the steps of a method for joining the terminal of the electrostatic chuck according to the present invention.

The electrostatic chuck was manufactured according to the procedure shown in FIG. 2 and the bonding of the substrate and the terminal was performed according to the procedure shown in FIG. 3. The diameter of the terminal used for bonding was 5 mm. The corner radius R1 between tip and side portions of the terminal was set to 0.3 mm. Moreover, the corner radius R2 between bottom and side portions of the terminal bonding hole was set to 0.3 mm. In this case, Al—Mg alloy was used as the brazing filler metal. As the particles, alumina particles having an average particle size of 40 μm, which were Ni-plated in a thickness of 1 to 2 μm, were used. The brazing filler metal and the particles were adjusted in a 1:1 ratio to obtain the bottom portion bonding material 4. Moreover, Al—Ni—Au alloy was used as the side portion bonding material 5. The thickness of the bottom portion bonding material 4 was 0.3 mm and the thickness of the side portion bonding material 5 was 0.05 mm. The corner portion between the tip and side portions of the terminal 1 was covered with the bottom portion bonding material 4. Moreover, the bonding conditions were as follows:

It was confirmed that 19 out of the 20 electrostatic chucks showed no occurrence of cracks and the yields were 95%.

Figure 4A:
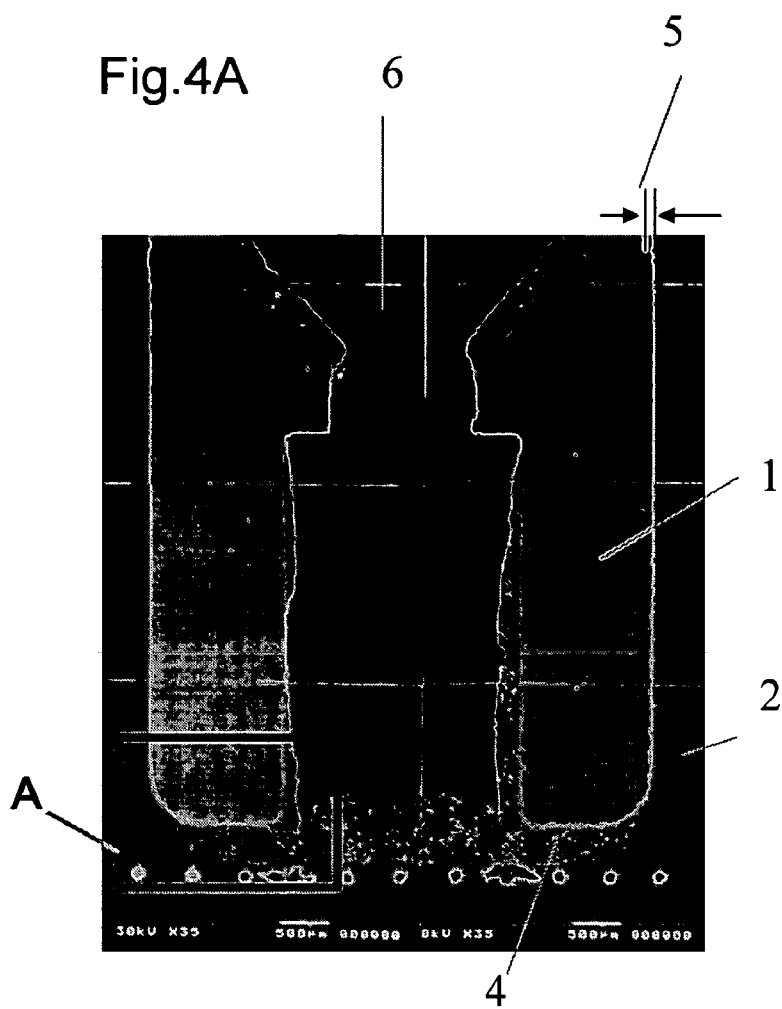
FIG. 4A is a cross-sectional SEM photograph of a terminal bonding portion of an electrostatic chuck in Example 1.
Figure 4B:
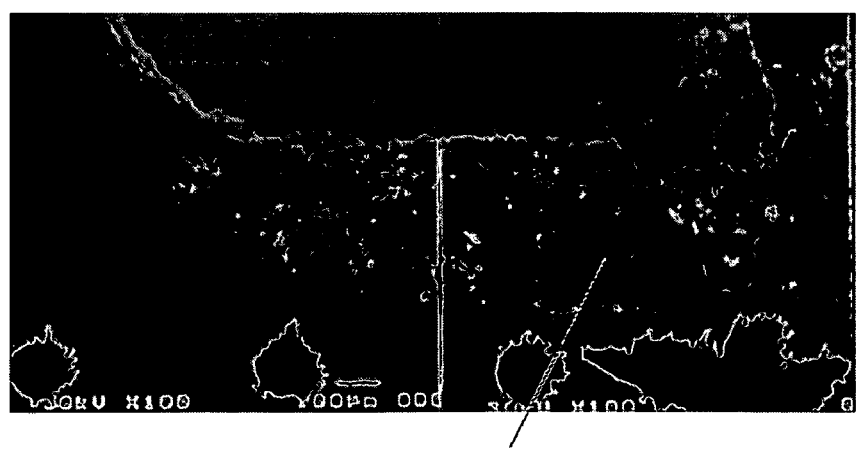
FIG. 4B is an enlarged view of section A in FIG. 4A.

FIGS. 4A and 4B are cross-sectional SEM photographs showing the terminal bonding portion used in Example 1. FIG. 4B is an enlarged view of the section A in FIG. 4A. The bottom portion bonding material 4 covers the corner portion of the terminal 1. Moreover, there is no occurrence of cracks in the corner portion.

Example 2

In Example 2, bonding was performed using a terminal which had a diameter of 10 mm and a corner radius R1 of 0.3 mm between its tip and side portions. The corner radius R2 between bottom and side portions of the terminal bonding hole 8 was set to 0.5 mm. The thickness of the side portion bonding material 5 was 0.10 mm. The procedure for manufacturing an electrostatic chuck, the procedure for joining the terminal, the kind of bottom portion bonding material and side portion bonding material, the thickness of the bottom portion bonding material and the bonding conditions were similar to those of Example 1. Moreover, the corner portion of the tip portion of the terminal was covered with the bottom portion bonding material 4. The foregoing bonding test was performed for twenty electrostatic chucks and the number of electrostatic chucks showing occurrence of cracks was evaluated. The results are also shown in Table 1.

It was confirmed that 18 out of the 20 electrostatic chucks of Example 2 showed no occurrence of cracks, and the yields were 90%.

Comparative Example 1

In Comparative Example 1, for comparison with Examples 1 and 2, bonding was performed using a terminal which had a diameter of 5 mm and a corner radius R1 of 0.3 mm between its tip and side portions. The corner radius R2 between bottom and side portions of the terminal bonding hole 8 was 0.8 mm. The procedure for manufacturing the electrostatic chuck, the procedure for joining the terminal, the kind and thickness of both the bottom portion bonding material and the side portion bonding material, and the bonding conditions were similar to those of Example 1. Moreover, the corner portion of the tip portion of the terminal was not covered with the bottom portion bonding material. The foregoing bonding test was performed for twenty electrostatic chucks and the number of electrostatic chucks which showed occurrence of cracks was evaluated. The results are also shown in Table 1.

It was confirmed that only 10 out of the 20 electrostatic chucks showed no occurrence of cracks, and the yields were 50%.

Figure 5A:
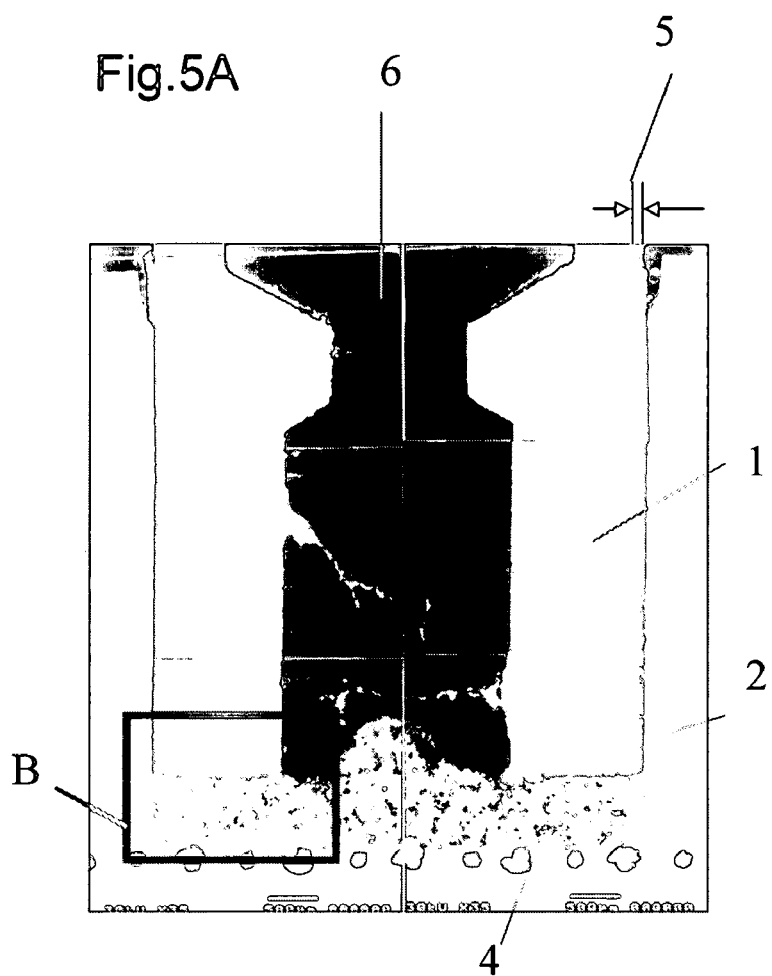
FIG. 5A is a cross-sectional SEM photograph of a terminal bonding portion of an electrostatic chuck in Comparative Example 1.
Figure 5B:
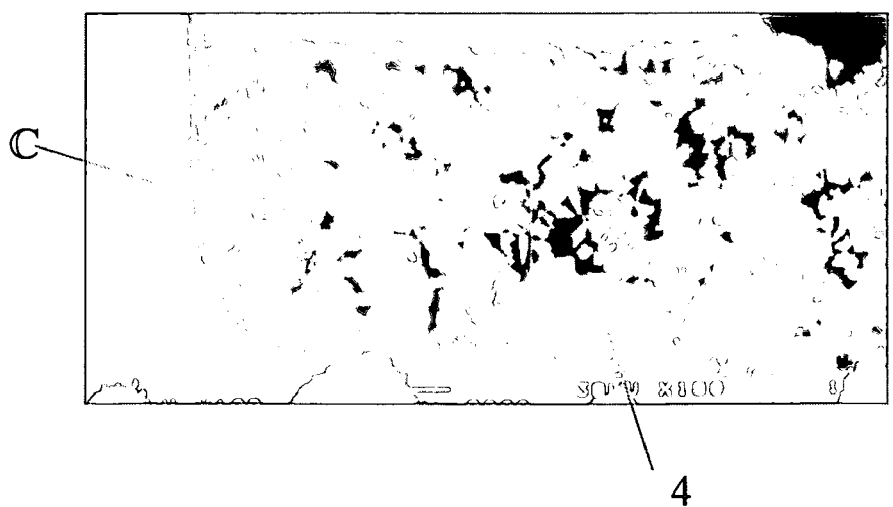
FIG. 5B is an enlarged view of section B in FIG. 5A.

Moreover, FIGS. 5A and 5B are cross-sectional SEM photographs showing the terminal bonding portion used in Comparative Example 1. FIG. 5B is an enlarged view of the section B in FIG. 5A. The bottom portion bonding material 4 does not cover the corner portion of the terminal 1. In this case, there was the occurrence of a crack C in the substrate 2 from the corner portion of the terminal 1.

Comparative Example 2

In Comparative Example 2, for comparison with Examples 1 and 2, bonding was performed using a terminal which had a diameter of 10 mm and a corner radius R1 of 0.3 mm between its tip and side portions. The corner radius R2 between bottom and side portions of the terminal bonding hole 8 was 0.8 mm. The procedure for manufacturing the electrostatic chuck, the procedure for joining the terminal, the kind and thickness of both the bottom portion bonding material and the side portion bonding material, and the bonding conditions were similar to those of Example 2. However, like Comparative Example 1, the corner portion of the tip portion of the terminal was not covered with the bottom portion bonding material 4. The foregoing bonding test was performed for twenty electrostatic chucks and the number of electrostatic chucks which showed occurrence of cracks was evaluated. The results are also shown in Table 1.

It was confirmed that only 9 out of the 20 electrostatic chucks showed no occurrence of cracks and the yields were 45%.

Comparative Example 3

In Comparative Example 3, for comparison with Examples 1 and 2, bonding was performed using a terminal which had a diameter of 5 mm and a corner radius R1 of 0.5 mm between its tip and side portions. The corner radius R2 between bottom and side portions of a terminal bonding hole 8 was 0.3 mm. The thickness of the side portion bonding material 5 was 0.02 mm. The procedure for manufacturing the electrostatic chuck, the procedure for joining the terminal, the kind of the bottom portion bonding material and the side portion bonding material, the thickness of the bottom portion bonding material, and the bonding conditions were similar to those of Example 1. However, like Comparative Example 1, the corner portion of the tip portion of the terminal was not covered with the bottom portion bonding material 4. The foregoing bonding test was performed for twenty electrostatic chucks and the number of electrostatic chucks which showed occurrence of cracks was evaluated. The results are also shown in Table 1.

It was confirmed that only 10 out of the 20 electrostatic chucks showed no occurrence of cracks and the yields were 50%.

Comparative Example 4

In Comparative Example 4, for comparison with Examples 1 and 2, bonding was performed using a terminal which had a diameter of 5 mm and a corner radius R1 of 0.3 mm between its tip and side portions. The corner radius R2 between bottom and side portions of the terminal bonding hole 8 was 0.8 mm. The thickness of the side portion bonding material 5 was 0.08 mm. The procedure for manufacturing the electrostatic chuck, the procedure for joining the terminal, the kind of the bottom portion bonding material and the side portion bonding material, the thickness of the bottom portion bonding material, and the bonding conditions were similar to those of Example 1. However, like Comparative Example 1, the corner portion of the tip portion of the terminal was not covered with the bottom portion bonding material 4. The foregoing bonding test was performed for twenty electrostatic chucks and the number of electrostatic chucks which showed occurrence of cracks was evaluated. The results are also shown in Table 1.

It was confirmed that 8 out of the 20 electrostatic chucks showed no occurrence of cracks and the yields were 40%.

Comparative Example 5

In Comparative Example 5, for comparison with Examples 1 and 2, bonding was performed using a terminal which had a diameter of 5 mm and a corner radius R1 of 0.1 mm between its tip and side portions. The corner radius R2 between bottom and side portions of the terminal bonding hole 8 was 0.5 mm. The thickness of the side portion bonding material 5 was 0.05 mm. The procedure for manufacturing the electrostatic chuck, the procedure for joining the terminal, the kind of the bottom portion bonding material and the side portion bonding material, the thickness of the bottom portion bonding material, and the bonding conditions were similar to those of Example 1. However, like Comparative Example 1, the corner portion of the tip portion of the terminal was not covered with the bottom portion bonding material 4. The foregoing bonding test was performed for twenty electrostatic chucks and the number of electrostatic chucks which showed occurrence of cracks was evaluated. The results are shown in Table 1.

It was confirmed that 8 out of the 20 electrostatic chucks showed no occurrence of cracks and yields were 40%.

CONCLUSION

It was confirmed that the yields in Examples 1 and 2 were as high as 90 to 95%, while the yields in Comparative Examples 1 to 5 were 40 to 50%. Therefore, it was confirmed that cracks were unlikely to occur when the bottom portion bonding material 4 covered the corner portion of the terminal. Furthermore, it was confirmed that cracks were unlikely to occur when the corner radius R1 of the tip portion of the terminal was 0.3 mm or more. Moreover, in Examples 1 and 2, the corner radius R1 between the tip and side portions of the terminal and the corner radius R2 between the bottom and side portions of the terminal bonding hole satisfied the condition of $R1 \geq R2 \times 0.6$. Furthermore, the thickness of the side portion bonding material 5 was 0.008 to 0.012 times the diameter of the terminal in Examples 1 and 2, while the thickness thereof was outside of this value range in Comparative Examples 3 and 4.

What is claimed is:

1. A bonding member comprising:
   a ceramic member having a concave portion;
   a metal member having a convex portion fitted to the concave portion;
   a first bonding material joining a bottom portion of the concave portion of the ceramic member and a tip portion of the convex portion of the metal member, the first bonding material having a porous structure including particles and a brazing filler metal that covers a corner between a tip portion and a side portion of the metal member; and
   a second bonding material including a brazing filler metal joining a side portion of the concave portion of the ceramic member and a side portion of the convex portion of the metal member.

2. The bonding member of claim 1, wherein, when a corner radius between the tip and side portions of the convex portion of the metal member is R1, and when a corner radius between a bottom portion and a side portion of the concave portion of the ceramic member is R2, a condition of $R1 \geq R2 \times 0.6$ is satisfied.

3. The bonding member of claim 1, wherein a corner radius between the tip and side portions of the convex portion of the metal member is not less than 0.3 mm.

4. A bonding member comprising:
   a ceramic member having a concave portion;
   a metal member having a convex portion fitted to the concave portion of the ceramic member;
   a first bonding material joining a bottom portion of the concave portion of the ceramic member and a tip portion of the convex portion of the metal member, the first bonding material having a porous structure including particles and a brazing filler metal that covers a corner between a tip portion and a side portion of the metal member; and
   a second bonding material including a brazing filler metal joining a side portion of the concave portion of the ceramic member and a side portion of the convex portion of the metal member; and
   at least one vent hole penetrating entirely through the metal member from an inside portion of the convex portion to an outer surface of the metal member in at least one of a vertical direction and a horizontal direction.

5. The bonding member of claim 4, wherein the at least one vent hole in the convex portion of the metal member comprises a first vent hole penetrating through the metal member in the vertical direction, and a second vent hole penetrating through the metal member in the horizontal direction.

6. An electrostatic chuck for adsorbing an object to be processed, the electrostatic chuck comprising:
   a substrate including an electrode therein and having a concave terminal bonding hole;
   a terminal member made of a different material from that of the substrate which supplies power to the electrode;
   a bottom portion bonding material joining a bottom portion of the terminal bonding hole of the substrate and a tip portion of the terminal, the bottom portion bonding material having a porous structure including particles and brazing filler metal covering a corner between a tip portion and a side portion of the terminal member; and
   a side portion bonding material including a brazing filler metal joining a side portion of the terminal bonding hole of the substrate and a side portion of the terminal member.

7. The electrostatic chuck of claim 6, wherein, when a corner radius between the tip and side portions of the terminal member is R1, and when a corner radius between the bottom and side portions of the terminal bonding hole of the substrate is R2, a condition of $R1 \geq R2 \times 0.6$ is satisfied.

8. The electrostatic chuck of claim 6, wherein a corner radius between the tip and side portions of the terminal member is not less than 0.3 mm.

9. The electrostatic chuck of claim 6, wherein the side portion bonding material has a thickness dimension which is 0.008 to 0.012 times a diameter of the terminal member.

10. The electrostatic chuck of claim 6, further comprising a bonding material housing hole housing a brazing filler metal before bonding inside a convex tip of the terminal member.

11. The electrostatic chuck of claim 6, further comprising a at least one vent hole penetrating through the terminal member in at least one of a vertical direction and a horizontal direction from an inside portion of the terminal member proximate a bottom portion of the terminal member.

* * * * *